(12) United States Patent
Singh

(10) Patent No.: US 7,467,368 B1
(45) Date of Patent: Dec. 16, 2008

(54) CIRCUIT CLUSTERING DURING PLACEMENT

(75) Inventor: Amit Singh, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 197 days.

(21) Appl. No.: 11/504,472

(22) Filed: Aug. 14, 2006

Related U.S. Application Data

(62) Division of application No. 10/676,929, filed on Sep. 30, 2003, now Pat. No. 7,111,262.

(51) Int. Cl.
*G06F 17/50* (2006.01)
(52) U.S. Cl. .............................. 716/7; 716/8
(58) Field of Classification Search ................ 716/7–11
See application file for complete search history.

(56) References Cited

U.S. PATENT DOCUMENTS

| 5,475,830 | A | 12/1995 | Chen et al. | |
|---|---|---|---|---|
| 6,099,580 | A | 8/2000 | Boyle et al. | |
| 6,813,754 | B2 * | 11/2004 | Wu et al. | 716/10 |
| 6,957,412 | B1 * | 10/2005 | Betz et al. | 716/16 |
| 7,111,262 | B1 * | 9/2006 | Singh | 716/7 |
| 7,290,239 | B1 * | 10/2007 | Singh et al. | 716/18 |
| 2004/0250226 | A1 | 12/2004 | Lin et al. | |

OTHER PUBLICATIONS

Donath, Wilm E.; "Placement and Average Interconnection Lengths of Computer Logic"; Circuits and Systems, IEEE Transactions on; vol. 26, Issue 4; Apr. 1979; pp. 272-277.
DeHon, Andre; "Balancing Interconnect and Computation in A Reconfigurable Computing Array" International Symposium on Field Programmable Gate Arrays Archive Proceedings of the 1999 ACM/SIGDA Seventh International Symposium on FPGAs; 1999; pp. 69-78 [1-10].
Singh, Amit et al.; "Efficient Circuit Clustering for Area and Power Reduction in FPGAs"; International Symposium on FPGAs, 2002; Copyright Association for Computing Machinery; 8 pages.
Landman, B. S. et al.; "On a Pin Versus block Relationship for Partitions of Logic Graphs"; IEEE Transactions on Computers, vol. C-20, No. 12, Dec. 1971; pp. 1469-1479.
Russo, R. L. et al.; "A Computer-Based-Design Approach to Partitioning and Mapping of Computer Logic Graphs"; Proceedings of the IEEE; vol. 60; Issue 1; Jan. 1072; pp. 28-34.
Parthasarathy, G. et al.; "Interconnect Complexity-Aware FPGA Placement Using Tent's Rule"; Proceedings of the 2001 International Workshop on System-Level Interconnect Prediction; Mar. 2001; pp. 115-121.
Singh, Amit et al.; Interconnect Resource-Aware Placement for Hierarchical FPGAs; Proceedings of the 2001 IEEE/ACM International Conference on Computer-Aided Design; Nov. 2001; pp. 132-136.

(Continued)

*Primary Examiner*—Thuan Do
*Assistant Examiner*—Binh C Tat
(74) *Attorney, Agent, or Firm*—Kevin Cuenot

(57) ABSTRACT

A method of physical circuit design can include the steps of packing components of a circuit design that are dependent upon an architecture of the circuit design and assigning initial locations to each component of the circuit design. The components of the circuit design can be clustered by combining slices and including slices into configurable logic blocks according to design constraints, while leaving enough white space in the configurable logic blocks for post-placement circuit optimizations. The components of the circuit design then can be placed to minimize critical connections. The circuit design can be declustered to perform additional placer optimization tasks on the declustered circuit design.

2 Claims, 3 Drawing Sheets

OTHER PUBLICATIONS

Marquardt, Alexander et al.; "Using Cluster-Based Logic Blocks and Timing-Driven Packing to Improve FPGA Speed and Density"; Proceedings of the 1999 ACM/SIGDA Seventh International Symposium on Field Programmable; pp. 37-46.

* cited by examiner

CIRCUIT CLUSTERING DURING PLACEMENT

BACKGROUND

1. Field of the Invention

The invention relates to the field of physical circuit design and, more particularly, to packing and clustering components of a circuit design.

2. Description of the Related Art

Circuit designs, and particularly designs for Field Programmable Gate Arrays (FPGA's), have become increasingly complex and heterogeneous. Modern circuit designs can include a variety of different components or resources including, but not limited to, registers, block Random Access Memory (RAM), multipliers, processors, and the like. This increasing complexity makes placement and signal routing of circuit designs more cumbersome.

Circuit packing provides a degree of simplification. Circuit packing refers to the grouping or association of circuit components into larger clusters of components. For a given design, a packer "packs" circuit components together based on particular objective functions. Each clustered grouping of components then can be treated as a single, larger component for purposes of circuit placement and signal routing. The packing process effectively reduces the number of components to be processed during subsequent circuit design tasks.

Packing refers to both mandatory packing as well as non-mandatory packing. Mandatory packing refers to packing operations that are performed as dictated by the circuit architecture. For example, mandatory packing can include packing objects so as to implement carry chains, block random access memory (RAM), or other circuit structures. In contrast, non-mandatory packing refers to the packing of objects for purposes that are unrelated to the underlying circuit architecture. For example, non-mandatory packing can include packing components to achieve a particular signal propagation delay based upon topological circuit information.

Packing typically occurs prior to the placement and routing tasks of physical circuit design. Accordingly, as noted, the packing task serves to simplify circuit design as once components are clustered together as a single, larger circuit component, the placing and routing tasks effectively are left with fewer components to process. Unfortunately, the tradeoff for this simplification is reduced granularity. In other words, while having fewer components to place and route simplifies circuit design, the reduced granularity affords fewer choices with respect to circuit placement and routing.

What is needed is a technique which provides the benefits of circuit packing while not restricting granularity or the choices available to subsequent circuit design tasks.

SUMMARY OF THE INVENTION

The present invention provides a method, system, and apparatus for performing physical circuit design. More particularly, an exemplary embodiment of the present invention provides a solution for packing a circuit design during the placement phase. White space may be incorporated into the circuit design during the packing phase so as to leave adequate space for performing post-placement circuit optimizations after circuit placement.

Post-placement circuit optimization attempts to re-optimize critical portions of a circuit design by placing critical components close to one another. Non-critical components are moved away from the vicinity of critical components. By incorporating white space into the circuit design during the packing phase, the task of post-placement circuit optimization is simplified. That is, the problem of remapping the circuit design is alleviated by a priori leaving white space in the vicinity of critical components. White space insertion also aids in relieving routing congestion by reducing the usable pin density and spreading the circuit logic.

One embodiment of the present invention can include a method of physical circuit design. The method can include the step of packing components of a circuit design that are dependent upon an architecture of the circuit design and assigning initial locations to each component of the circuit design. The components of the circuit design can be clustered by combining slices and including slices into configurable logic blocks according to design constraints, wherein a cluster of components include white space such as an unused region(s). The components of the circuit design then can be placed to minimize critical connections. The circuit design can be declustered to perform additional post-placement placer tasks on the declustered circuit design.

The clustering step can operate only on components that are not dependent upon the architecture of the circuit design. Also, the step of assigning initial locations need not be timing driven. The clustering step can include slices into a configurable logic block so long as the total number of inputs and outputs of the resulting configurable logic block does not exceed a threshold number of inputs and outputs. The threshold number of inputs and outputs can be less than the number of inputs and outputs that can physically be accommodated by the configurable logic block so as to leave white space in the configurable logic block for post-placement circuit optimizations.

In another embodiment of the present invention, the clustering step can include the step of combining slices that share control signals and clock sources such that the total number of components of the combined slice does not exceed a threshold number of components. The clustering step further can include the step of adding a slice to a configurable logic block if the slice has a critical attraction to a slice already included in the configurable logic block. The clustering step also can include the step of using fanout to determine which slice is included in the configurable logic block if more than one slice to be added to the configurable logic block each has an equivalent critical attraction to a slice within the configurable logic block.

In yet another embodiment, the clustering step can include the steps of selecting a critical connection of the circuit design, identifying a first slice connected to the critical connection, and if the first slice is not clustered, identifying a second slice having a most critical attraction to the first slice. Accordingly, the second slice can be included with the first slice in a configurable logic block if the total number of inputs and outputs of the resulting configurable logic block does not exceed a threshold number of inputs and outputs. Notably, the threshold number of inputs and outputs can be less than the number of inputs and outputs that can physically be accommodated by the configurable logic block so as to leave white space in the configurable logic block for post-placement circuit optimizations. The process can be repeated for further slices connected to the critical connection, as well as for further critical connections.

Another embodiment of the present invention can include a method of clustering a circuit design including selecting a critical connection of the circuit design, identifying a first slice connected to the critical connection, and if the first slice is not clustered, identifying a second slice having a most critical attraction to the first slice. The second slice can be included with the first slice in a configurable logic block if the total number of inputs and outputs of the resulting configurable logic block does not exceed a threshold number of inputs and outputs. As noted, the threshold number of inputs and outputs can be less than the number of inputs and outputs that can physically be accommodated by the configurable logic block so as to leave white space in the configurable logic block for post-placement circuit optimizations. The process can be repeated for further slices connected to the critical connection as well as for additional critical connections.

Notably, the step of including the second slice with the first slice within a configurable logic block can combine slices that share control signals and clock sources such that the total number of components of the combined slice does not exceed a threshold number of components. Further, a slice can be added to a configurable logic block if the slice has a critical attraction to a slice already included in the configurable logic block. Fanout can be used to determine which slice is included in a configurable logic block if more than one slice to be added to the configurable logic block each has an equivalent critical attraction to a slice within the configurable logic block.

Other embodiments of the present invention, when configured in accordance with the inventive arrangements disclosed herein, can include a system for performing, and a machine readable storage for causing a machine to perform, the various processes disclosed herein.

BRIEF DESCRIPTION OF THE DRAWINGS

There are shown in the drawings, embodiments which are presently preferred, it being understood, however, that the invention is not limited to the precise arrangements and instrumentalities shown.

DETAILED DESCRIPTION OF THE INVENTION

The present invention provides a solution for improving the physical layout of a circuit design. In accordance with the inventive arrangements disclosed herein, a significant amount of packing is performed in the placement phase of physical circuit design. By packing most components during placement, decisions relating to packing can be made at a time when physical information regarding the circuit design is available, rather than making packing decisions earlier in the design process without the benefit of such information.

The circuit design is clustered by restricting the amount of logic that can be packed together. This technique ensures that white space, or unused space, is present in the clustered circuit design for post-placement optimizations. As a result of performing fewer packings at the beginning of the physical design process, placement can be performed on a finer grained circuit design representation, thereby leading to an improved physical circuit design.

Figure 1:
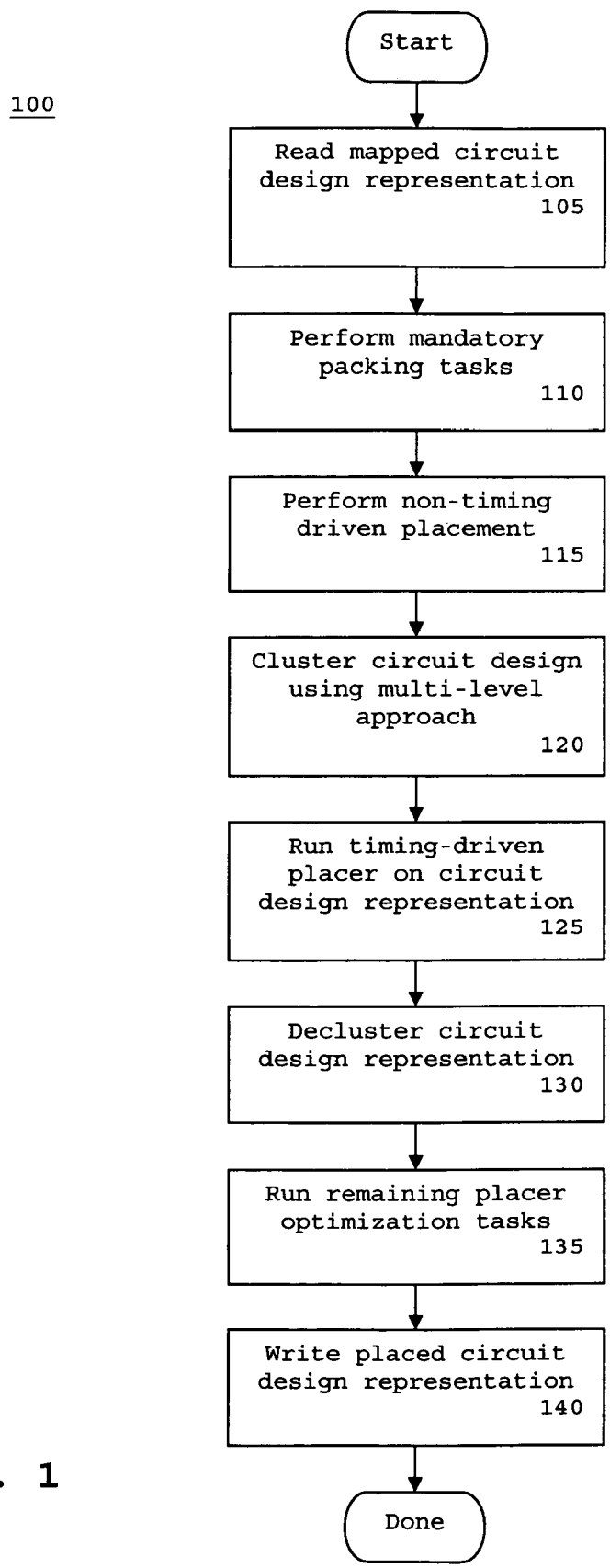
FIG. 1 is a flow chart illustrating a method of physical circuit design in accordance with one embodiment of the inventive arrangements disclosed herein.

FIG. 1 is a flow chart illustrating a method 100 of physical circuit design in accordance with one embodiment of the inventive arrangements disclosed herein. The method 100 can be implemented by a software-based circuit design tool that can receive, pack, place, and route a circuit design representation. As is known, placing refers to assigning components of a circuit design to physical locations on a chip and routing refers to routing signals, or forming connections, between components of the circuit design.

Circuit designs or circuit design representations can include any physical description of a circuit design in terms of the components to be used, including but not limited to, netlists, circuit descriptions conforming to open standards such as the Berkeley Logic Interchange Format (BLIF), as well as circuit descriptions conforming to proprietary standards such as Native Circuit Description as used by Xilinx, Inc. of San Jose, Calif.

The method 100 can begin in step 105 where a mapped circuit design representation is read into the design tool. In step 110, mandatory packing tasks can be performed. Mandatory packing tasks are packing operations that that are performed as dictated by the architecture of the circuit under development. For example, mandatory packing can include packing objects so as to implement carry chains, block random access memory (RAM), or other circuit structures related to circuit architecture. Accordingly, circuit components whose placement with respect to one another is dictated by circuit architecture can be packed in step 110.

In step 115, a non-timing driven fast placement task can be performed. Components of the circuit design representation can be assigned initial locations relating to the physical layout of the circuit design. This initial placement task can be performed rapidly as timing considerations are not taken into account. Accordingly, slices, configurable logic blocks (CLB's), and look up tables (LUT's), as determined during the mandatory packing task, can be assigned initial locations with respect to the physical circuit design.

A slice is an association of one or more circuit components such as LUT's and flip flops, around which a boundary can be established. Typically, a slice can include a limited number of LUT's and flip flops. The number of components that can be included within a slice varies according to manufacturer and the type of circuit being developed. According to one embodiment of the present invention, slices can be limited to having no more than 2 LUT's and 2 flip flops. Still, those skilled in the art will recognize that any number of LUT's and flip flops can be included within a slice component as may be desired by the circuit designer.

Once components are associated or grouped as a slice, the slice can be treated as a single larger component that occupies an area corresponding to the established boundaries of the slice. This allows the slice to be manipulated as a single unit rather than as a series of individual components.

A CLB component is a collection of slices. Like slices, CLB's can be treated as a single component. The number of slices that can be included within a CLB also can vary according to the circuit design and manufacturer. According to one embodiment of the present invention, CLB's are limited to including 4 slices. Still, as was the case with slices, those skilled in the art will recognize that any number of slices can be included in a CLB as may be determined or desired by a circuit designer.

In step 120, the circuit design representation can be clustered using a multi-level approach. That is, slices can be combined with one another according to design constraints. Slices also can be clustered within CLB's in conformance with additional design constraints. Clustering is done such that white space, i.e., unoccupied or unused region(s), is left in a circuit cluster, for example a CLB (see FIGS. 3A, 3B, 4A, and 4B, below). This white space may be used for post-placement circuit optimizations. After clustering, the placer can be run on the circuit design representation in step 125. The placer can perform a timing analysis on the circuit design representation. The placer places components in a manner that seeks to minimize critical connections between components.

The criticality of a connection can be measured by the "slack" of a connection. Slack is the difference between the time a signal is to arrive at a particular destination to meet established design constraints and the actual time, or estimated time as determined by the design tool, at which the signal arrives. The more negative the slack, the more critical the connection.

In step 130, the circuit design representation can be declustered. Declustering the circuit design representation allows the design tool to remedy any poor clustering decisions made during clustering step 120. In general, unclustered components can be analyzed and relocated. Notably, the relocation or re-assignment of components is restricted to a local neighborhood surrounding each component. By limiting the area in which a component can be relocated, the spirit of the initial clustering can be maintained while also seeking to correct any poor clustering decisions.

In step 135, any remaining post-placement placer optimization tasks can be run on the circuit design representation. The resulting circuit design representation can be written or stored in step 140. After completion of step 140, the method can end.

Figure 2:
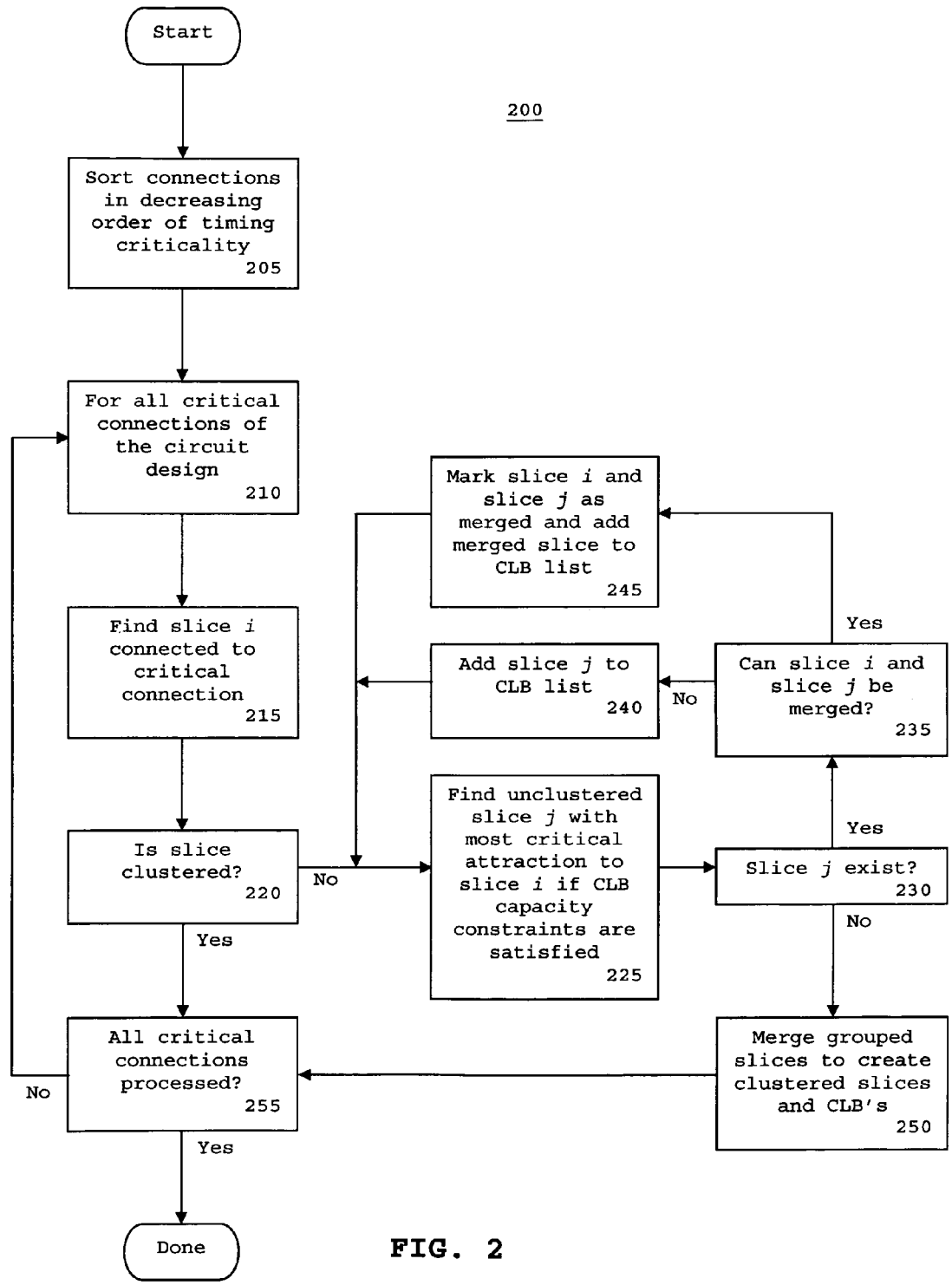
FIG. 2 is a flow chart illustrating a method of clustering in accordance with one embodiment of the inventive arrangements disclosed herein.

FIG. 2 is a flow chart illustrating a method 200 of clustering in accordance with one embodiment of the inventive arrangements disclosed herein. The method 200 illustrates a multi-level clustering technique as depicted in step 120 of FIG. 1. The method 200 can begin in step 205, where connections of the circuit design can be sorted according to the timing criticality of each connection. The connections can be sorted or ordered according to decreasing timing criticality.

In step 210, the method can begin processing each critical connection of the circuit design. As noted, the more negative the slack of a connection, the more critical the connection. According to one embodiment of the present invention, connections can be identified as critical if the slack of the connection is less than a predetermined threshold. In any case, the unclustered connections can be processed. Slices connected to the connections can be selected as cluster seeds. An attraction cost function based upon the criticality of the connection between the unclustered slice and the current open cluster (CLB), or slice within the CLB, can be used to attract unclustered slices to the cluster seeds.

In step 215, a slice i connected to a first selected critical connection can be identified. As the connections have been sorted according to decreasing timing criticality, the method can begin processing the most critical connections prior to less critical connections.

In step 220, a determination can be made as to whether the slice has been clustered or processed. If not, the method can proceed to step 225. If so, the method can continue to step 255. Continuing with step 225, another slice j having the most critical attraction to slice i can be identified or found. A measure of critical attractiveness can be the timing criticality of a connection between two slices, such that the more negative the slack of a connection, the higher the attraction between the two slices. Step 225 determines whether slice i and slice j can both be included within a particular CLB or open cluster.

Slice j can be included in a CLB with slice i only if CLB capacity constraints are satisfied. CLB capacity constraints dictate whether slices can be combined according to several different criteria. One such constraint specifies that the number of slices that can be included within a CLB cannot exceed a particular threshold. As noted, while this threshold can vary from circuit to circuit and manufacturer to manufacturer, according to one embodiment of the present invention, a CLB can include no more than 4 slices.

Another constraint specifies that each CLB can include no more than a particular number of connections. That is, the total number of inputs and outputs to the CLB cannot exceed a given threshold. The constraints ensure that while more slices may be included within a CLB, the CLB will retain a minimum amount of white space for subsequent post-placement circuit optimizations. Accordingly, the threshold number of inputs and outputs is less than the total number of inputs and outputs that can physically be accommodated by the configurable logic block so as to leave white space in the configurable logic block for post-placement circuit optimizations.

In step 230, a determination can be made as to whether slice j exists. If so, then slice j can be included within the same CLB as slice i and the method can proceed to step 235. If not, the method can continue to step 250.

In step 235, a determination can be made as to whether slice i and slice j can be merged together into a single, larger slice. In evaluating whether the two slices can be merged, additional constraints can be evaluated such as whether the two slices share common control signals and clock sources. Both constraints must be met in order to combine the two slices. Another constraint that must be met in order to combine the two slices is that the total number of components in the resulting combined slice cannot exceed thresholds for the maximum number of LUT's and/or flip flops in the resulting slice. If this constraint also is met, the two slices can be combined.

If slice i and slice j can be combined, the method proceeds to step 245 where the slices each are marked as being merged. The merged slice is then added to the CLB list. If the two slices cannot be merged, the method can proceed to step 240 where slice j is independently added to the CLB list.

The method can loop back to step 225 until no further slices are identified as having a critical attraction to slice i. In that case, the method can proceed to step 250 where grouped slices can be merged to create clustered slices and CLB's. After step 250, the method can proceed to step 255 to determine whether all of the critical connections have been processed. If so, the method can end. If not, however, the method can loop back to step 210 to continue processing further critical connections as may be necessary.

Figure 3A:
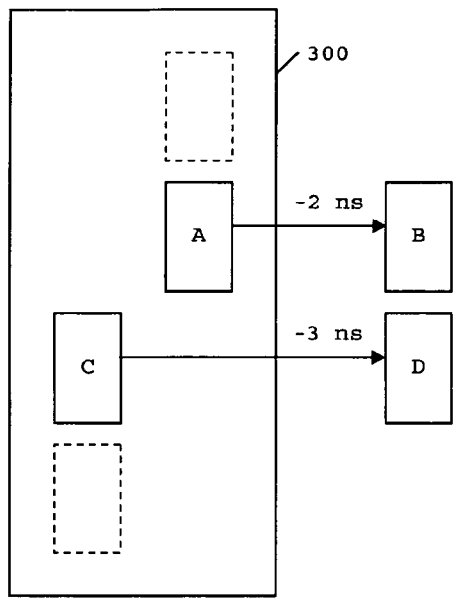
FIGS. 3A and 3B are schematic diagrams illustrating configurable logic blocks including slices in accordance with one embodiment of the inventive arrangements disclosed herein.
Figure 3B:
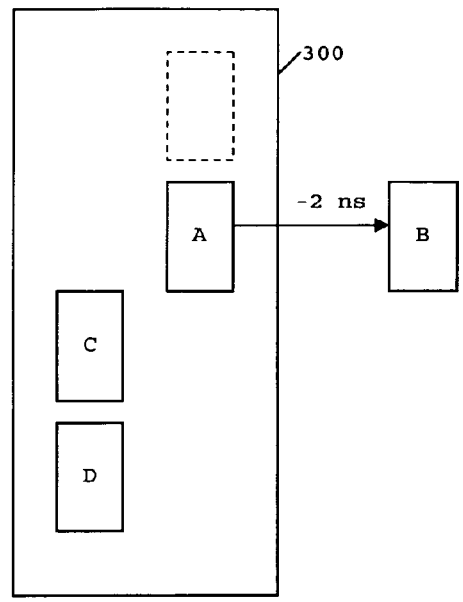

FIGS. 3A and 3B are schematic diagrams illustrating a CLB 300 including slices in accordance with one embodiment of the inventive arrangements disclosed herein. As shown in FIG. 3A, CLB 300 is capable of including 4 slices. Slice A and slice C have been incorporated into CLB 300, leaving two available positions for slices, each indicated by a dashed rectangle.

The slack of the connection between slice A and B is −2 ns, while the slack of the connection between slice C and D is −3 ns. Accordingly, the connection between slice C and D is more timing critical than the connection between slice A and B. Thus, FIG. 3B illustrates that slice D, the slice having the most critical attraction to the open cluster, has been incorporated into the cluster.

Figure 4A:
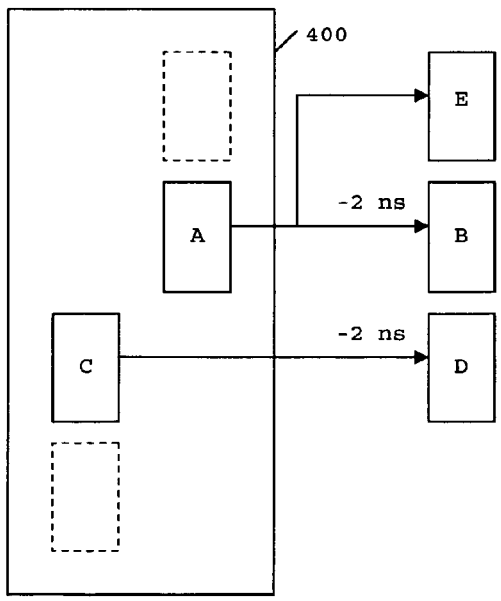
FIGS. 4A and 4B are schematic diagrams illustrating configurable logic blocks including slices in accordance with another embodiment of the inventive arrangements disclosed herein.
Figure 4B:
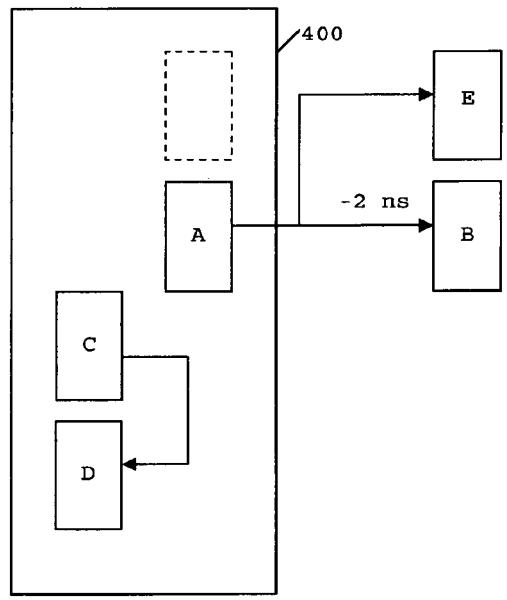

FIGS. 4A and 4B are schematic diagrams illustrating a CLB 400 including slices in accordance with another embodiment of the inventive arrangements disclosed herein. FIGS. 4A and 4B illustrate another technique for determining which slice has a higher critical attraction to a given slice or CLB in the event that slack is not sufficient.

As shown in FIG. 4A, CLB 400 can accommodate 4 slices. Slices A and C have already been located within CLB 400. Slices B, D, and E, which are external to CLB 400, each have a slack of −2 ns. As such, each has an equivalent critical attraction to slice A or C.

In this case, an additional constraint can be used to determine which slice can be incorporated into CLB 400. According to one embodiment of the present invention, high fanout nets can be disfavored during the clustering process. Thus, as shown in FIG. 4B, slice D has been included within CLB 400 rather than slice B or E.

The inventive arrangements disclosed herein provide a solution for performing physical circuit design. The present invention performs most non-mandatory circuit packing in relation to the placement task where physical information about the circuit is available. Accordingly, critical components are clustered close together in a manner that a priori leaves white space in the vicinity of critical components for later circuit optimization. Post-placement circuit optimization re-optimizes the critical portions of the circuit by placing critical components close together while moving non-critical components away from the vicinity of critical components. As a result, the full solution space can be investigated without undoing the overall benefit obtained from clustering.

The present invention can be realized in hardware, software, or a combination of hardware and software. The present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

The present invention also can be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

This invention can be embodied in other forms without departing from the spirit or essential attributes thereof. Accordingly, reference should be made to the following claims, rather than to the foregoing specification, as indicating the scope of the invention.

What is claimed is:

1. A method of clustering a circuit design, comprising the steps of:
    selecting a configurable logic block comprising a first slice and a second slice, wherein the first slice is connected to at least a first load slice through a first critical connection and the second slice is connected to at least a second load slice through a second critical connection;
    determining that the first critical connection and the second critical connection have equivalent critical attractions;
    determining fanout of the first slice and fanout of the second slice;
    selecting the first slice or the second slice according to lowest fanout;
    locating each load slice of the selected slice within the configurable logic block when the total number of inputs and outputs of the resulting configurable logic block do not exceed a threshold number of inputs and outputs, and wherein the threshold number of inputs and outputs is less than the number of inputs and outputs that physically be accommodated by the configurable logic block so as to leave white space in the configurable logic block for post-placement circuit optimizations; and
    combining slices that share control signals and clock sources such that the total number of components of the combined slice does not exceed a threshold number of components.

2. The method of claim 1, further comprising adding a slice to a configurable logic block if the slice has a critical attraction to a slice already included in the configurable logic block.

* * * * *